United States Patent
Pekny

(10) Patent No.: US 8,891,321 B2
(45) Date of Patent: Nov. 18, 2014

(54) OUTPUTTING A PARTICULAR DATA QUANTIZATION FROM MEMORY

(71) Applicant: Micron Technology, Inc., Boise, ID (US)

(72) Inventor: Theodore T. Pekny, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/899,034

(22) Filed: May 21, 2013

(65) Prior Publication Data
US 2013/0297893 A1 Nov. 7, 2013

Related U.S. Application Data

(63) Continuation of application No. 13/010,589, filed on Jan. 20, 2011, now Pat. No. 8,446,786.

(51) Int. Cl.
| | | |
|---|---|---|
| *G11C 7/00* | (2006.01) | |
| *G11C 16/26* | (2006.01) | |
| *G11C 11/56* | (2006.01) | |
| *G11C 16/34* | (2006.01) | |
| *G11C 16/06* | (2006.01) | |
| *G06F 12/00* | (2006.01) | |

(52) U.S. Cl.
CPC ........ *G06F 12/00* (2013.01); *G11C 2211/5642* (2013.01); *G11C 16/26* (2013.01); *G11C 2211/5644* (2013.01); *G11C 11/5642* (2013.01); *G11C 16/34* (2013.01); *G11C 2211/5641* (2013.01); *G11C 16/06* (2013.01)
USPC ............... 365/196; 365/189.011; 365/185.03; 365/185.24

(58) Field of Classification Search
USPC .......... 365/185.18, 196, 148, 185.03, 185.19, 365/185.11, 185.29, 185.33, 185.22; 348/222.1, 308, 302, 241
See application file for complete search history.

(56) References Cited

U.S. PATENT DOCUMENTS

| | | | |
|---|---|---|---|
| 4,309,772 A | * | 1/1982 | Kloker et al. ................. 375/317 |
| 6,154,157 A | | 11/2000 | Wong |
| 7,260,139 B2 | | 8/2007 | Tene et al. |

(Continued)

FOREIGN PATENT DOCUMENTS

| | | |
|---|---|---|
| JP | 10-507026 | 7/1998 |
| JP | 10-513295 | 12/1998 |

(Continued)

OTHER PUBLICATIONS

International Search Report and Opinion for related PCT Application No. PCT/US2012/021701, Mailed May 29, 2012, (10 pages).

(Continued)

*Primary Examiner* — Son Dinh
*Assistant Examiner* — Uyen B Tran
(74) *Attorney, Agent, or Firm* — Brooks, Cameron & Huebsch, PLLC

(57) ABSTRACT

The present disclosure includes methods, devices, and systems for outputting data particular quantization of data from memory devices and systems. Outputting data particular quantization of data can include enabling a particular one of a plurality of different quantizations of data. The particular one of the plurality of quantizations of data can then be output.

22 Claims, 6 Drawing Sheets

(56) References Cited

U.S. PATENT DOCUMENTS

| | | |
|---|---|---|
| 2004/0027463 A1 | 2/2004 | Kawamura |
| 2004/0062132 A1 | 4/2004 | Pascucci |
| 2006/0248415 A1 | 11/2006 | Hargan |
| 2009/0063730 A1 | 3/2009 | Gower et al. |
| 2009/0244973 A1 | 10/2009 | Scheppler et al. |
| 2009/0323422 A1* | 12/2009 | Alrod et al. ............. 365/185.18 |
| 2010/0034018 A1 | 2/2010 | Yang et al. |
| 2010/0153734 A1 | 6/2010 | Moskowitz et al. |
| 2010/0214855 A1 | 8/2010 | Baker |
| 2011/0066922 A1* | 3/2011 | Wezelenburg et al. ....... 714/773 |
| 2011/0074994 A1 | 3/2011 | Wakabayashi et al. |

FOREIGN PATENT DOCUMENTS

| | | |
|---|---|---|
| JP | 2002-510119 | 4/2002 |
| WO | 96/10256 | 4/1996 |
| WO | 96/14638 | 5/1996 |
| WO | 99/50853 | 10/1999 |
| WO | 2009148107 | 12/2009 |

OTHER PUBLICATIONS

Notice of Rejection for related Japanese Patent Application No. 2013-550560, dated Apr. 30, 2014, 6 pages.

Notice of Rejection for related Korean Patent Application No. 10-2013-7021766, dated Sep. 17, 2014, 10 pages.

* cited by examiner

OUTPUTTING A PARTICULAR DATA QUANTIZATION FROM MEMORY

PRIORITY APPLICATION INFORMATION

This application is a Continuation of U.S. application Ser. No. 13/010,589, filed Jan. 20, 2011, to be issued as U.S. Pat. No. 8,446,786, on May 21, 2013, which is incorporated herein by reference.

TECHNICAL FIELD

The present disclosure relates generally to semiconductor memory devices, methods, and systems, and more particularly, to methods, devices, and systems for outputting a particular data quantization from memory.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players, e.g., MP3 players, and movie players, among other electronic devices. Data, such as program code, user data, and/or system data, such as a basic input/output system (BIOS), are typically stored in flash memory devices.

Two common types of flash memory array architectures are the "NAND" and "NOR" architectures, so called for the logical form in which the basic memory cell configuration of each is arranged. A NAND array architecture arranges its array of memory cells in a matrix such that the control gates of each memory cell in a "row" of the array are coupled to (and in some cases form) an access line, which is commonly referred to in the art as a "word line". However each memory cell is not directly coupled to a data line (which is commonly referred to as a data line, e.g., a bit line, in the art) by its drain. Instead, the memory cells of the array are coupled together in series, source to drain, between a common source and a data line, where the memory cells commonly coupled to a particular data line are referred to as a "column".

Memory cells in a NAND array architecture can be programmed to a target, e.g., desired, state. For example, electric charge can be placed on or removed from a charge storage node of a memory cell to put the cell into one of a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells can be referred to as multilevel cells (MLCs). MLCs can allow the manufacture of higher density memories without increasing the number of memory cells since each cell can represent more than one digit, e.g., more than one bit. For example, a cell capable of representing four digits can have sixteen programmed states.

Sensing operations, e.g., read and/or program verify operations, use sensing voltages to determine the state of flash memory cells. However, a number of mechanisms, such as read disturb, program disturb, and/or charge loss, e.g., charge leakage, can cause the stored charge on the charge storage node, e.g., the threshold voltage (Vt), of the memory cells, to shift. Sensing operations that provide more detail about the charge stored on a selected memory cell, e.g., soft data, can be used to help correct for a shifted Vt.

DETAILED DESCRIPTION

Figure 1:
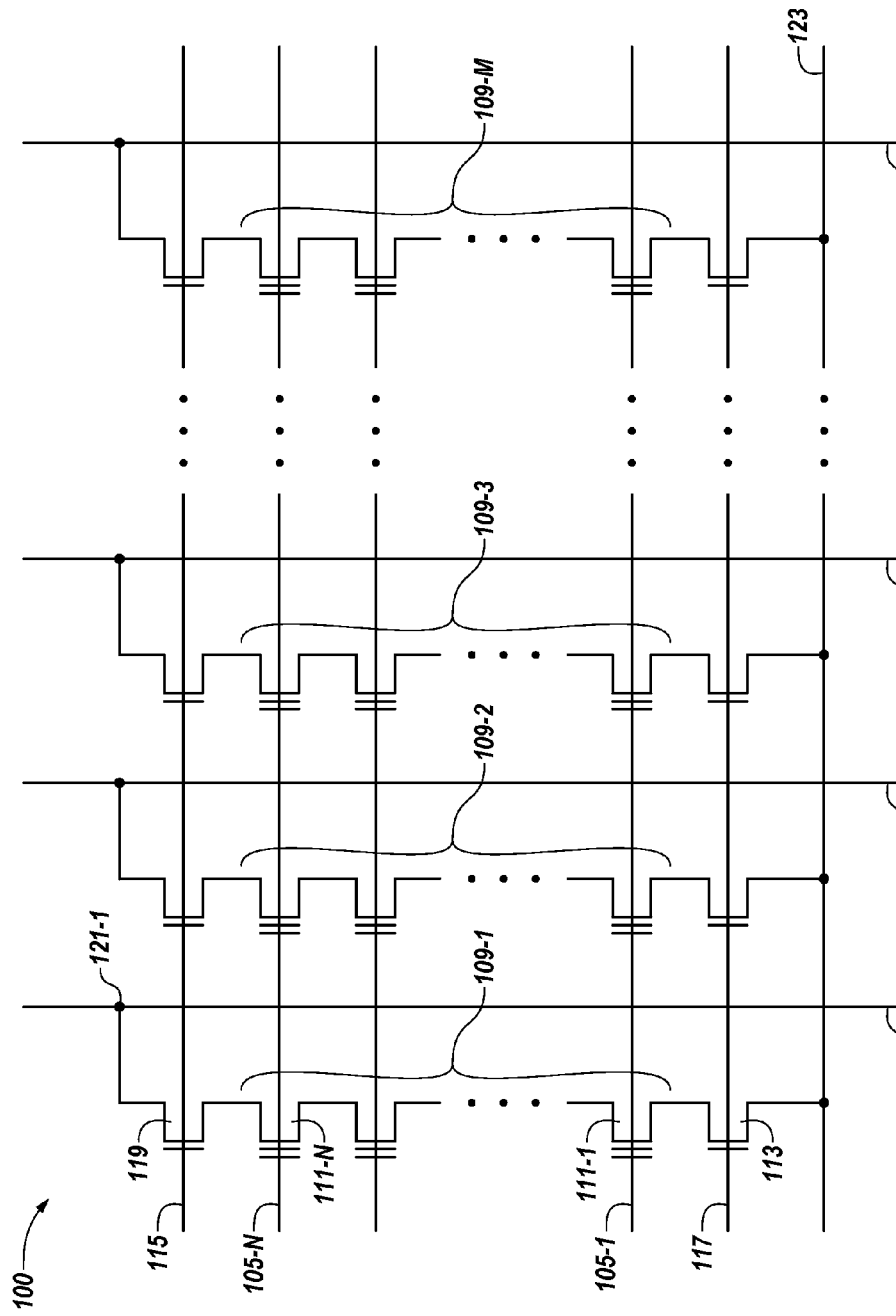
FIG. 1 illustrates a schematic diagram of a portion of a non-volatile memory array in accordance with one or more embodiments of the present disclosure.

The present disclosure includes methods, devices, and systems for outputting data particular quantization of data from memory devices and systems. Outputting data particular quantization of data can include enabling a particular one of a plurality of different quantizations of data. The particular one of the plurality of quantizations of data can then be output.

Soft data associated with a memory cell can indicate a location of a threshold voltage (Vt) of the memory cell within a Vt distribution representing the target state to which the memory cell was programmed, as will be further described herein. Additionally, soft data associated with a memory cell can indicate a probability of whether the Vt of the memory cell corresponds to the target state to which the memory cell was programmed, as will be further described herein. In contrast, data that corresponds to the data state a memory cell is determined to be in by a sensing operation can be referred to as hard data, as will be further described herein.

Embodiments of the present disclosure can output, e.g., selectively output, hard data without soft data to reduce I/O traffic as compared to outputting both hard and soft data. The soft data can still be used to facilitate accurate sensing of memory cells and can be used to adjust sensing of memory cells, e.g., a correspondence between a count provided while a ramping sensing signal is applied to a control gate of a selected memory cell and the hard data.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designators "N," "M," "P," and "Q" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 348 may reference element "48" in FIG. 3, and a similar element may be referenced as 448 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 illustrates a schematic diagram of a portion of a non-volatile memory array 100 in accordance with one or more embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, ..., 105-N and intersecting data lines, e.g., local bit lines 107-1, 107-2, 107-3, ..., 107-M. For ease of addressing in the digital environment, the number of word lines 105-1, ..., 105-N and the number of local bit lines 107-1, 107-2, 107-3, ..., 107-M can be some power of two, e.g., 256 word lines by 4,096 bit lines.

Memory array 100 includes NAND strings 109-1, 109-2, 109-3, ..., 109-M. Each NAND string includes non-volatile memory cells 111-1, ..., 111-N, each communicatively coupled to a respective word line 105-1, ..., 105-N. Each NAND string (and its constituent memory cells) is also associated with a local bit line 107-1, 107-2, 107-3, ..., 107-M. The non-volatile memory cells 111-1, ..., 111-N of each NAND string 109-1, 109-2, 109-3, ..., 109-M are connected in series source to drain between a source select gate (SGS), e.g., a field-effect transistor (PET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of the non-volatile memory cells 111-1, ..., 111-N includes a source, a drain, a floating gate or other charge storage node, and a control gate. The non-volatile memory cells 111-1, ..., 111-N have their control gates coupled to a word line, 105-1, ..., 105-N respectively. A "column" of the non-volatile memory cells, 111-1, ..., 111-N, make up the NAND strings 109-1, 109-2, 109-3, ..., 109-M, and are coupled to a given local bit line 107-1, 107-2, 107-3, ..., 107-M, respectively. A "row" of the non-volatile memory cells are those memory cells commonly coupled to a given word line 105-1, ..., 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, ..., 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line, e.g., bit line 107-1, associated with a selected memory cell above a voltage, e.g., bias voltage, provided to a source line, e.g., source line 123, associated with the selected memory cell. A sensing operation could alternatively include precharging the bit line 107-1 followed with discharge when a selected cell begins to conduct, and sensing the discharge.

Sensing the state of a selected cell can include providing a number of sensing signals, e.g., read voltages, to a selected word line while providing a number of pass signals, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
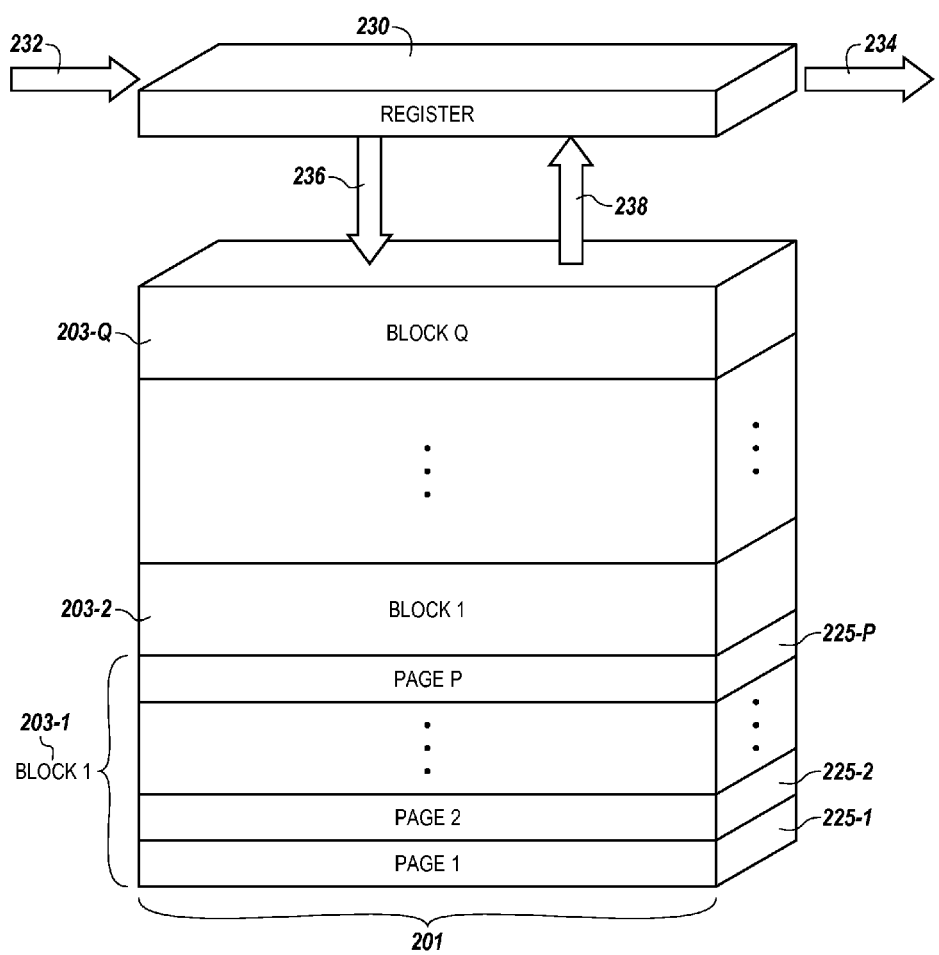
FIG. 2 illustrates a block diagram of a memory architecture in accordance with one or more embodiments of the present disclosure.

FIG. 2 illustrates a block diagram of a memory architecture in accordance with one or more embodiments of the present disclosure. The embodiment of FIG. 2 illustrates a number of pages, 225-1, 225-2, ..., 225-P, included in Block 1, 203-1. FIG. 2 also illustrates a number of blocks 203-1, 203-2, ..., 203-Q. According to the embodiment illustrated in FIG. 2, blocks 203-1, 203-2, ..., 203-Q together are included in plane 201. Embodiments are not limited to memory devices including one plane, as memory devices may include one plane or more than one plane. Only one plane 201 is illustrated in FIG. 2 so as not to obscure the teachings of the present disclosure.

As an example, a 2 GB memory device can include 2112 bytes of data per page, 64 pages per block, and 2048 blocks per plane. SLC devices store one bit per cell. MLC devices can store multiple bits per cell, e.g., 2 bits per cell. In a binary system, a "bit" represents one unit of data. As embodiments are not limited to a binary system, the smallest data element may be referred to herein as a "unit."

Plane 201 is shown in bidirectional communication with register 230 at 236 and 238. As one of ordinary skill in the art will appreciate, data can be transferred from register 230 to the memory plane 201 at 236 during programming operations. Data can also be transferred from the memory plane 201 to the register 230 during reading operations. Register 230 can output data to input/output (I/O) circuitry, e.g., 660 in FIG. 6, at 234 and can receive data from I/O circuitry at 232. In some embodiments of the present disclosure hard data can be output to I/O circuitry without outputting soft data, however embodiments are not so limited. For example, some embodiments can include outputting hard data and soft data, e.g., varying the amount of soft data output with hard data. Register 230 can communicate data with I/O circuitry through a number of data cycles. By way of example, a page of data, e.g., 2 kilobytes (kB) of data, can be loaded into register 230 through a number of 1 byte data cycles. Embodiments are not limited to memory devices including a 2 kB page size. Other page sizes can be used with embodiments of the present disclosure, e.g., 4 kB, 8 kB, etc. As the reader will appreciate, a partial page of data can be communicated to and/or from register 230.

Although FIG. 2 illustrates only one register 230 in association with the plane 201, embodiments are not so limited. In some embodiments, a plane 201 can include more than one register, such as a data register and a cache register. A data register can operate in an analogous fashion to register 230, as described above, in that it can transfer data to memory plane 201 and receive data from the memory plane 201. A cache register can operate in an analogous fashion to register 230, as described above, in that it can communicate data to and/or from I/O circuitry through a number of data cycles, e.g., data input cycles or data output cycles. In some embodiments, a register 230 can include a number of latches, where a latch can store one or more units of data.

For those embodiments including both a data register and a cache register, during non-cache operations, the data register and cache register can operate together as a single register, e.g., as register 230. During cache operations, data register and cache register can operate separately in a pipelined process. For example, during a program operation, data from I/O circuitry, e.g., from a host (for instance, from a processor associated with the host), can be loaded into the cache register, e.g., through a number of serially clocked data cycles, and then transferred from the cache register to the data register. After data is transferred to the data register, the contents of the data register can be programmed into memory plane 201. In an example read operation, data, e.g., hard data and soft data, can be read from memory plane 201 into data register. In another example read operation, hard data without soft data can be transferred from memory plane 201 into the data register. Whether the data register is loaded with hard data or hard data and soft data, the data in the data register can be transferred to the cache register. Whether the cache register is loaded with hard data or hard data and soft data, according to the present disclosure, hard data only, or hard data and soft data can be output to I/O circuitry. Such embodiments can be beneficial in improving a read bandwidth by reducing I/O traffic when soft data (or not as much soft data) is not needed or desired, as compared to outputting the hard data with the soft data to the I/O circuitry according to some previous approaches. For example, outputting hard data without soft data can reduce I/O traffic by 65%.

Figure 3:
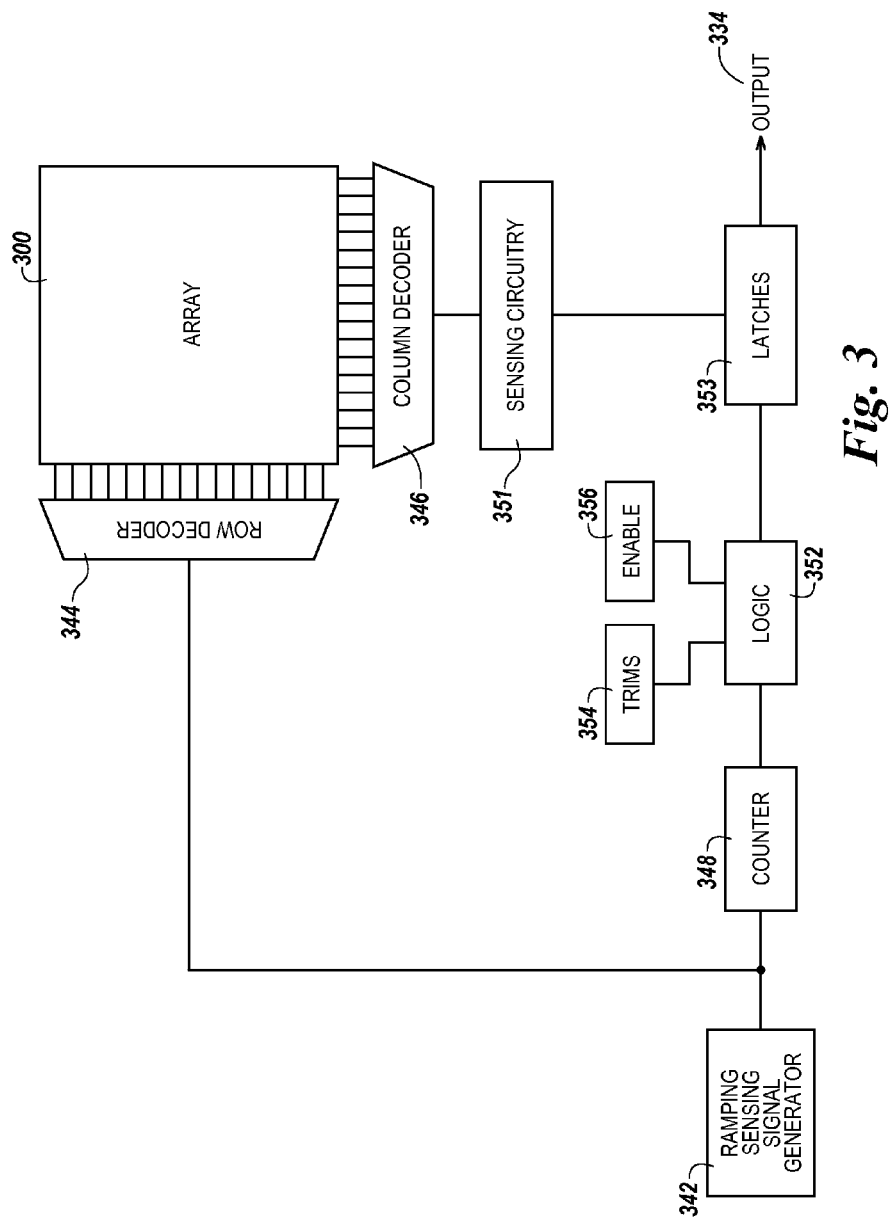
FIGS. 3-5 illustrate schematic diagrams of sensing circuits in accordance with one ore more embodiments of the present disclosure.

FIG. 3 illustrates a schematic diagram of a portion of a memory device in accordance with one ore more embodiments of the present disclosure. The portion of the memory device is illustrated in a reduced level of detail to facilitate explanation of embodiments of the present disclosure. As such, a portion of a memory device can include additional components not illustrated in FIG. 3.

Figure 6:
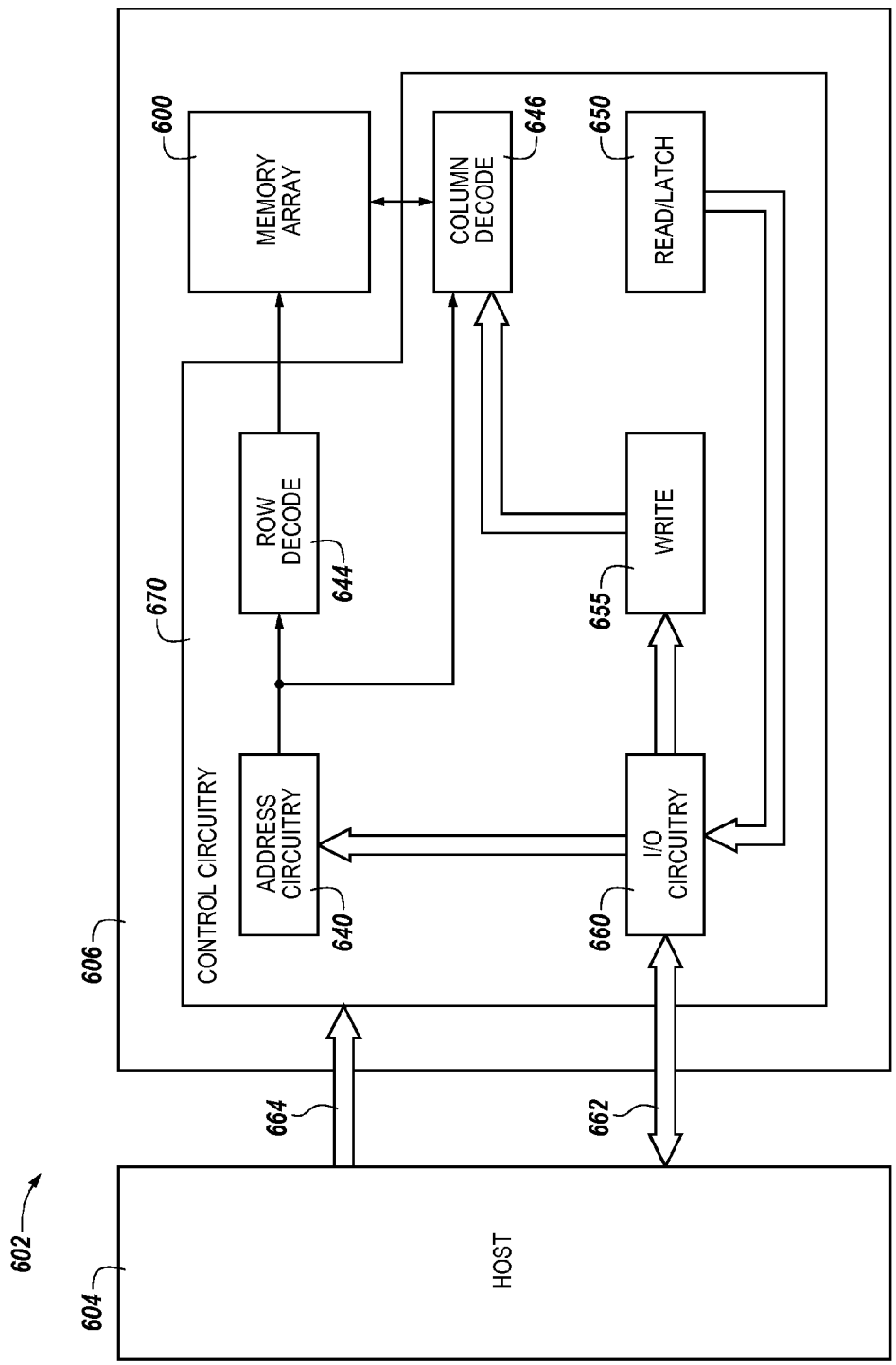
FIG. 6 illustrates a block diagram of an electronic memory system having a memory device operated in accordance with one or more embodiments of the present disclosure.

The portion of the memory device illustrated in FIG. 3 can include a memory array 300, e.g., analogous to memory array 100 illustrated in FIG. 1, and additional components that are collectively referred to as control circuitry, e.g., analogous to the control circuitry 670 illustrated in FIG. 6. The memory array 300 can represent a portion, e.g., a block, of a larger memory array. For example, a number of portions of the larger memory array can share a row decoder 344 and a number of portions of the larger memory array can share a column decoder 346, however embodiments are not so limited. Although the array 300 represents a portion of a larger array, it is referred to herein as an array 300 for ease of notation.

The control circuitry can include a row decoder 344 and a column decoder 346 coupled to the memory array 300. For example, the row decoder 344 and/or the column decoder 346 can be multiplexers and/or demultiplexers. The row decoder 344 can be coupled to a number of access lines of the memory array 300 and the column decoder 346 can be coupled to a number of data lines of the memory array 300. The row decoder 344 can select a particular access line and the column decoder can select a particular data line to facilitate selecting a particular memory cell coupled to each of the particular access line and the particular data line for programming and/or sensing the memory cell. For those embodiments in which the memory array 300 is a NAND array, memory cells within the array 300 can be programmed and/or sensed a page at a time, as described herein, e.g., a number of cells coupled to the particular access line can be programmed and/or sensed together. However, sensing operations may be described herein with respect to a single memory cell in order to promote understanding of the present disclosure.

The control circuitry can include a sensing signal generator 342, e.g., a voltage ramp generator, a current ramp generator, etc. The sensing signal generator can have an output to the row decoder 344 for applying the sensing signal to a control gate of a selected memory cell, e.g., via an access line coupled to the control gate of the a selected memory cell. The sensing signal generator can have an output to a counter 348 to provide a count, e.g., an n-unit value, while the sensing signal is applied to the control gate of the a selected memory cell. The use of the designators "m," "n," and "p" with respect to the count are unrelated to the designators "M," "N," "P," and "Q" with respect to the drawings. The numbers represented by these designators can be the same or different.

The sensing signal generator 342 can be a ramping sensing signal generator, such as one that can increase a magnitude of an output, e.g., a voltage, in accordance with a linear slope from a starting magnitude to a stopping magnitude in a period of time. The starting and stopping magnitudes can be selected to encompass a range of threshold voltages to which memory cells in the array 300 can be programmed, e.g., 0.5 volts to 4.5 volts. In this manner, the magnitude of the output can provide sensing capability for any program state of a selected memory cell with a single input, e.g., as opposed to using multiple discrete sensing signals, e.g., discrete voltages, to determine the state of the selected memory cell. The period of ramping can be selected to balance efficient sensing speeds with accurate detection of a threshold voltage (Vt). In one or more embodiments, the period can be less than 20 microseconds.

In one or more embodiments, the sensing signal generator 342 can provide an output to the counter 348 to start the count. The counter 348 can start a count and count over a particular range of values while the sensing signal is applied to the control gate of the selected memory cell. The counter can start at a first particular value and count up to a second particular value, e.g., from 00h to FFh (0-255). In one or more embodiments, the counter 348 can be incremented over the particular range at fixed clock cycles. The count can comprise an n-unit value. In some embodiments, the counter 348 can be a binary counter and the count can be an n-bit binary value. For example, if the count is equal to a decimal value of 251, and the counter 348 is a binary counter, the count can comprise an n-bit value, e.g., 8-bit value, equal to 11111011 in binary. Embodiments are not limited to a particular number of units for the count.

The count can include more units than are used to represent a data state of the selected memory cell. For example, if the selected memory cell is a 4-bit cell, then the combinations of different data states can be represented in binary with a 4-unit, e.g., 4-bit, count, such as 1011. However, as stated, the count includes more units than are used to represent the data state of the memory cell. Thus, for the example of a 4-bit memory cell, the count can include at least 5 units, e.g., bits. That is, the count includes a more unit than the number of units used to represent a data state of the memory cell. The units of the count nominally representing the data state of the memory cell are referred to as hard data. For example, a 5-bit count of 10101 may in some cases be determined to correspond to a data state of 1011, although the 5-bit count nominally represented a data state of 1010, e.g., the four most significant bits of the 5-bit count. The remaining units of the count are referred to as soft data, although the count may include additional units that are neither hard data, nor soft data, e.g., "dummy units." However, for ease of notation, these additional units are not included in the discussion of the n-unit count as described herein. Notationally, the count is an n-unit count including m-units of nominal hard data and p-units of soft data, where m+p=n and where each of m and p are less than n. In the example of an 8-bit count for a 4-bit memory cell, the count includes 8 total bits with 4 bits of nominal hard data (nominally representing the data state of the memory cell) and 4 bits of soft data, e.g., n is equal to 8, m is equal to 4 and p is equal to 4.

A 2-bit memory cell can have possible data states of 00, 01, 10, and 11. The 2-bit memory cell could be sensed with a ramping sensing signal and a counter configured to provide a count with no soft data, e.g., a count having a number of units equal to the number of units in the data state of the memory cell, which in this example is 2 bits. Thus, the counter could count 00, 01, 10, 11 at fixed clock cycles as the ramping sensing signal is applied to the control gate of the memory cell. However, as described herein, providing a count that allows for soft data can be beneficial in sensing memory cells because the soft data can be used to account for variations in Vt ranges of memory cells, e.g., the variations in the ranges of the amount of charge stored on a charge storage node of the memory cells corresponding to a particular data state. According to one or more embodiments of the present disclosure, the counter 348 can be incremented such that the count changes by more than one increment between each data state. In the example of the 2-bit cell, a 4-bit count could be used such that the counts 0000, 0001, 0010, 0011, 0100, could be counted while the sensing signal ramps from values corresponding to the data state of 00 to values corresponding to the data state of 01, e.g., the two most significant bits of the 4-bit count. However, as described herein, particularly with respect to the trims 354, embodiments of the present disclosure are not limited to representing hard data with the most significant bits of the count. Furthermore, embodiments are not limited to any particular correspondence between the count and the value associated with a data state.

The soft data, e.g., extra units of the count, can provide more detailed information on the amount of charge stored in the memory cell. For example, if the 2-bit memory cell was programmed to a target data state of 01, if a 4-bit count of 0100 indicates an "exact" data state of 01, and if the count is latched as the memory cell begins to conduct at least partially in response to the ramping sensing signal being applied to its control gate, then a latched 4-bit count of 0011 can indicate that the memory cell has slightly less charge than the targeted amount corresponding to data state 01, and a latched 4-bit count of 0101 can indicate that the memory cell has slightly more charge than the targeted amount corresponding to data state 01. Soft data, either for a particular memory cell, or cumulatively over a number of memory cells, can be used to adjust sensing operations to account for changes in the amount of charge stored in memory cells for a corresponding data state to improve the accuracy of later sensing operations. For example, error correction code (ECC) can be used with the soft data to correct data received from a sensing operation that may have been inaccurate due to variations in the amount of charge stored in one or more memory cells.

The Vt of a memory cell can change, e.g., shift, over time due to a number of mechanisms. For example, the charge storage node, e.g., floating gate, of the memory cell may lose charge over time. That is, charge may leak from the charge storage node. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the Vt of the memory cell to change over time, as will be appreciated by one of ordinary skill in the art.

In some instances, such a Vt change can alter the state of the memory cell. For example, if the memory cell were programmed to a target state, e.g., data state 01, charge loss could cause the Vt of the memory cell to decrease to a level less than the target state, or possibly to a level within a lower data state, e.g., data state 00. Accordingly, such a Vt change can result in erroneous data being sensed during a sensing operation performed on the memory cell.

The counter 348 can have an output to logic 352. For example, the logic 352 can be a combinational logic block, e.g., combination logic, including a number of logic gates. In one or more embodiments, the logic 352 can include approximately 200 gates. The logic 352 can be configured to convert the count provided by the counter 348 from a first quantization n to a second quantization m. For example, the logic 352 can be configured to convert the count from an n-unit value to an m-unit value, where the m-unit value might comprise only the hard data, and where m is less than n. For those embodiments in which the counter 348 is a binary counter, the n-unit value can be an n-bit binary value and the logic 352 can be configured to covert the n-bit binary value to an m-bit binary value, which might only correspond to the hard data, for example. For example, an 8-bit count of 10011110 could be converted to a 4-bit hard data value of 1010 by the logic 352.

The logic 352 can convert the count continuously "on the fly" as it is provided to the logic 352 by the counter 348, so that when the sensing circuitry 351 detects that the selected memory cell conducts, the latches 353 can latch the converted value. Such conversion functionality of the logic 352 can be selectively enabled as described herein such that the logic 352 can either convert the count to corresponding hard data without soft data, or pass all n units of the count to the latches 353. In some embodiments, the latches 353 can be included in a register, e.g., register 230 illustrated in FIG. 2.

The logic 352 can include one or more trims 354 configured to adjust the conversion between the first quantization, e.g., the n-unit count, and the second quantization, e.g., the m-units of hard data. For example, the trims 354 can be set by a user or automatically by control circuitry to adjust the conversion between the count and the hard data. A range of n-unit counts can be converted to a particular m-unit hard data state. Each range can be adjusted by the trims 354, including a boundary for each corresponding hard data state, e.g., a lower-most n-unit value of the count that corresponds to a particular hard data state, a width of the range, e.g., the number of different n-unit counts that fall within the range, and/or endpoints of the range, e.g., a numerically first and a numerically last n-unit count that define the endpoints of the range. For example, a 2-bit data state of 01 can correspond to a range of 4-bit counts from 0011 to 0110, where the width of the range and the endpoints can be adjusted, e.g., set, by the trims 354. The conversion between the n-unit count and the m-units of hard data can be adjusted according to the p-units of soft data within the n-unit count.

Because soft data can indicate a location of a Vt within a Vt distribution and/or a probability of whether a Vt corresponds to a target state, soft data can be used to track and/or compensate for a Vt change. For example, more bits of hard data obtained from a read operation may be correctable if the hard data is read using an adjusted, e.g., trimmed, conversion between the count and the hard data states based on soft data than if the hard data is read using an unadjusted count or a count adjusted according to some previous approaches. Additionally, hard data read using a trimmed conversion may be correctable for a longer period of time, e.g., a greater number of program and erase cycles. That is, a longer period of time, e.g., a greater number of program and erase cycles, may pass until the trimmed conversion needs to be trimmed again due to an additional Vt shift.

The control circuitry can be configured to store the soft data. For example, the control circuitry can include memory, e.g., DRAM (not specifically illustrated) that stores the soft data. The memory can be used exclusively to store soft data, or the memory can store additional data along with soft data. Subsequent, e.g., future, adjustments of the conversion between the count and the output data, e.g., hard data can be adjusted based, at least partially, on the stored soft data.

The logic 352 can include an input 356 to selectively enable the logic 352. When the logic 352 is enabled, it can function to convert the count from an n-unit quantization of data to an m-unit quantization of data, e.g., corresponding to just the hard data as described herein. When the logic 352 is not enabled, the count, e.g., including hard data and soft data, can be output to the latches 353. The logic 352 can convert the count from an n-unit quantization of data to one of a plurality of levels of data quantization, e.g., levels of data quantization from m to n. The one of the plurality of levels can be selected, e.g., by a user or by control circuitry automatically. In some embodiments, the one of the plurality of levels can be selected based on an age of the memory device. For example, the logic 352 can be enabled early in the life of a memory device before ECC becomes more necessary. For example, an age of a memory device can be determined with reference to a number of program-erase cycles of the memory device, where a greater number indicates an older age. As will be appreciated, as a memory device ages, the Vt for various states may begin to shift. As these shifts become more significant, the extra information from the count, e.g., soft data, may be more useful to the memory device to correct for a Vt shift, and thus the logic 352 may be selectively disabled. As described herein, the logic 352 can be selectively enabled and/or disabled by a command, e.g., a user command and/or a command from control circuitry.

Although the sensing circuitry 351 is illustrated separate from the column decoder 346, in one or more embodiments, the sensing circuitry 351 can be incorporated with the column decoder 346. Likewise, the latches 353 and/or a register including the latches 353 can be incorporated with the sensing circuitry 351 and/or the column decoder 346. The term "sensing circuitry" is used generally herein to refer to one or more of the column decoder 346, the sensing circuitry 351, a register, e.g., register 230 illustrated in FIG. 2, and/or the latches 353. In some embodiments the sensing circuitry 351 can include one or more sense amplifiers. When the sensing circuitry 351, e.g., a sense amplifier, trips, it can indicate to that a selected memory cell has reacted to input from the ramping sensing signal generator by conducting, e.g., that a state of the selected memory cell has been sensed.

The sensing circuitry 351 can output a signal to the latches 353 to cause the latches to latch a quantization of data, such as that provided either from the counter 348, e.g., the n-unit count, when the logic 352 is not enabled by the enable input 356, or a particular m-unit quantization of the data, e.g., just the hard data, from the logic 352 when the logic 352 is selectively enabled by the enable input 356. The latches 353 can include a number of individual data latches, where each of the individual data latches can store one unit of data, e.g., a bit. In one or more embodiments, the latches 353 can include at least n-number of latches, corresponding to the n-unit count. The latches 353 can latch an m-unit value from the logic 352 at least partially in response to the ramping sensing signal causing the selected memory cell to conduct prior to the hard data being output when the logic 352 is selectively enabled by the enable input 356. The latches 353 can latch the quantization of data provided from the logic 352, e.g., whether it is an n-unit quantization, and m-unit quantization, or some other particular quantization.

According to the present disclosure, the sensing circuitry 351 can cause a particular quantization of data, e.g., hard data only, the n-unit count, or an m-unit quantization of data that includes some soft data, but not all p-units of the soft data, at least partially in response to the ramping sensing signal causing the selected memory cell to conduct. In one or more embodiments, the sensing circuitry can be configured to output m-units of hard data from the n-number of latches. The output 334 can be analogous to the output 234 illustrated in FIG. 2 and/or to the I/O circuitry 660 and/or the I/O connections 662 illustrated in FIG. 6.

Figure 4:
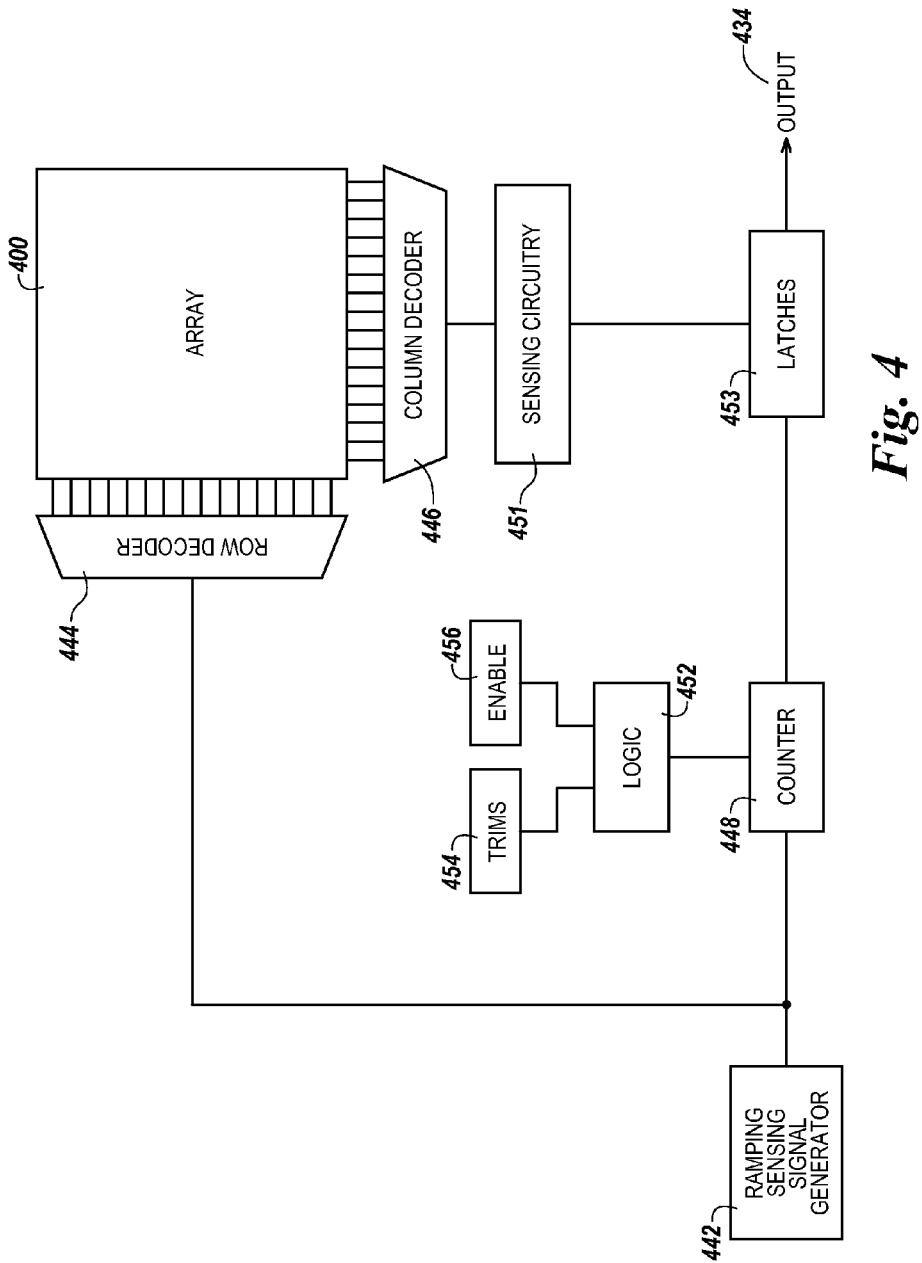

FIG. 4 illustrates a schematic diagram of a portion of a memory device in accordance with one ore more embodiments of the present disclosure. The portion of the memory device is illustrated in a reduced level of detail to facilitate explanation of embodiments of the present disclosure. As such, a portion of a memory device can include additional components not illustrated in FIG. 4.

The portion of the memory device illustrated in FIG. 4 can include a number of components analogous to those illustrated in FIG. 3. For example, memory array 400, row decoder 444, column decoder 446, sensing circuitry 451, latches 453, output 434, ramping sensing signal generator 442, counter 448, logic 452, trims 454, and enable input 456 can be analogous to memory array 300, row decoder 344, column decoder 346, sensing circuitry 351, latches 353, output 334, ramping sensing signal generator 342, counter 348, logic 352, trims 354, and enable input 356 illustrated in FIG. 3, respectively. Accordingly, with respect to FIG. 4, primarily the differences in connectivity and functionality will be described.

The ramping sensing signal generator 442 can have an output to the row decoder 444 (and thus to the control gates of memory cells therein, e.g., via a number of access lines) and to the counter 448. The counter 448 can have an output to sensing circuitry, e.g., latches 453, and input from logic 452, in contrast to FIG. 3, where the counter 348 had an output to the logic 352. The counter 448 can be configured to provide a first quantization of data, e.g., an n-unit count, while the ramping sensing signal is applied to the control gate of a selected memory cell within the array of memory cells 400.

The logic 452, e.g., a state machine, can be configured to control the count provided by the counter 448 such that the count can provide a particular quantization of data, such as hard data and all soft data, hard data and some soft data, or hard data without soft data. For example, the counter 448 can be a binary counter and the logic 452 can, e.g., selectively, control the counter 448 to increment the count in binary increments corresponding to hard data states as controlled by the logic 452. More specifically, the counter 448 can be configured to provide an n-unit count, as described above with respect to counter 348, however, the logic 452 can be configured to control the count such that it increments in m-unit values corresponding to hard data states, thus, when enabled, m-units of hard data are output from the counter 448 to the latches 453 at least partially in response to the ramping sensing signal causing the selected memory cell to conduct. For example, the count can be controlled such that it increments from 00000000 to 00010000 to 00100000, and so on. The logic 452 can control the counter 448 such that the controller 448 only outputs the m-number of most significant bits (MSBs), e.g., trimmed MSBs when enabled, from the counter to the latches 453. For example, a data path between the counter 448 and latches 453 can be such that the output of the counter 448 is serial starting with the MSBs, and, thus, the logic 452 can stop the output from the counter 448 after m-number of bits. The logic 452 can include one or more trims 454 configured to adjust the incrementation, e.g., binary increments, and the hard data states as described herein. For example, the trims 454 can adjust the change in count, e.g., incrementation, such that there is asymmetry between data states, e.g., such that different hard data states correspond to different relative increments. Accordingly, one or more embodiments of the present disclosure can include a downcounter (not specifically illustrated) to adjust the count negatively in response to a negative Vt shift. However, embodiments are not so limited, as the logic 452 can adjust the count negatively without the use of a downcounter. The asymmetric correspondence can be further adjusted using the trims 454, e.g., in response to different Vt shifts for different hard data states as described herein. The logic 452 can include an enable input 456 to selectively enable the logic 452 to control the count as described herein.

Although the sensing circuitry 451 is illustrated as being separate from the column decoder 446, in one or more embodiments, the sensing circuitry 451 can be incorporated with the column decoder 446. Likewise, the latches 453 can be incorporated with the sensing circuitry 451, a register, and/or the column decoder 446. The term "sensing circuitry" is used generally herein to refer to one or more of the column decoder 446, the sensing circuitry 451, and/or the latches 453. The sensing circuitry can be configured to output the, e.g., selectively, controlled count at least partially in response to the ramping sensing signal causing the selected memory cell to conduct. For example, the sensing circuitry 451 can output the count from the latches 453 through the output 434. The latches 453 can include at least n-number of individual latches, each able to store one unit of data. The sensing circuitry can be configured to output, for example, m-number of units of hard data without soft data, e.g., where the logic 452 controls the counter 448 to increment in m-unit values and output m-unit values to the latches 453, at least partially in response to the ramping sensing signal causing the selected memory cell to conduct.

Figure 5:
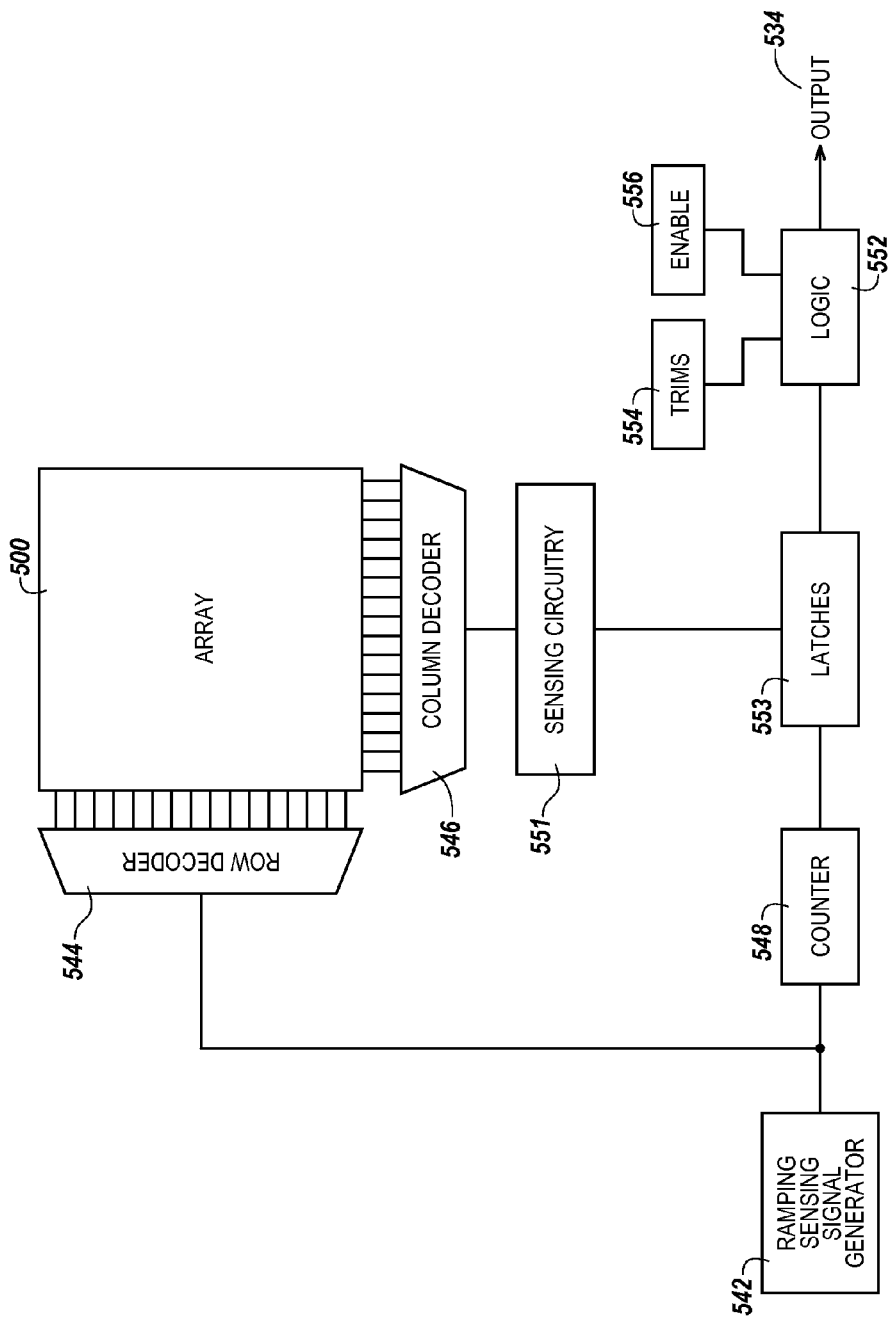

FIG. 5 illustrates a schematic diagram of a portion of a memory device in accordance with one ore more embodiments of the present disclosure. The portion of the memory device is illustrated in a reduced level of detail to facilitate explanation of embodiments of the present disclosure. As such, a portion of a memory device can include additional components not illustrated in FIG. 5.

The portion of the memory device illustrated in FIG. 5 can include a number of components analogous to those illustrated in FIG. 3. For example, memory array 500, row decoder 544, column decoder 546, sensing circuitry 551, latches 553, output 534, ramping sensing signal generator 542, counter 548, logic 552, trims 554, and enable input 556 can be analogous to memory array 300, row decoder 344, column decoder 346, sensing circuitry 351, latches 353, output 334, ramping sensing signal generator 342, counter 348, logic 352, trims 354, and enable input 356 illustrated in FIG. 3, respectively. Accordingly, with respect to FIG. 5, primarily the differences in connectivity and functionality will be described.

The ramping sensing signal generator can have an output to the row decoder 544 (and thus to the control gates of memory cells therein, e.g., via a number of access lines) and to the counter 548. The counter 548 can have an output to sensing circuitry, e.g., latches 553. The counter 548 can be configured to provide a first quantization of data, e.g., an n-unit count, while the ramping sensing signal is applied to the control gate of a selected memory cell within the array of memory cells 500. The sensing circuitry, e.g., latches 553 can have an output to logic 552, e.g., in contrast to FIG. 3, where the logic 352 received an input from the counter 348 and had an output to the latches 353. The sensing circuitry can be configured to output the count to the logic 552 at least partially in response to the ramping sensing signal causing the selected memory cell to conduct.

Although the sensing circuitry 551 is illustrated separate from the column decoder 546, in one or more embodiments, the sensing circuitry 551 can be incorporated with the column decoder 546. Likewise, the latches 553 can be incorporated with the sensing circuitry 551 and/or the column decoder 546. The term "sensing circuitry" is used generally herein to refer to one or more of the column decoder 546, the sensing circuitry 551, and/or the latches 553.

The logic 552, e.g., a combinational logic block including combination logic, can be configured to, e.g., selectively, convert the count from a first quantization of data, e.g., an n-unit count, to a second quantization of data, e.g., m-units of hard data. For example, the count can be an n-unit value including p-units of soft data. The logic 552 can be configured to convert the n-unit value to an m-unit value comprising the hard data, where m and p are each less than n. The latches 553 can include at least n-number of latches configured to store the n-unit value from the counter 548. The logic 552 can include one or more trims 554 configured to adjust the conversion between the first quantization and the second quantization as described herein. For example, the logic 552 can be configured to adjust the conversion between the count and the hard data using the one or more trims 554 according to the p-units of soft data stored in the at least n-number of latches 553. The logic 552 can reconvert the count (or other quantization of data) to hard data (or other quantization of data) corresponding to the adjusted conversion without the ramping sensing signal being output to the control gate of the selected memory cell again. Such embodiments can provide for a fast "re-read" without actually accessing the memory cell again, which can reduce wear on the memory cell and provide for faster output. The logic 552 can include an enable input 556 to selectively enable the logic 552 to convert the count as described herein.

FIG. 6 illustrates a block diagram of an electronic memory system 602 having a memory device 606 operated in accordance with one or more embodiments of the present disclosure. The memory system 602 includes a host 604, e.g., a processor, a computing device including one or more processors, an application specific integrated circuit (ASIC), etc., coupled to the memory device 606. The memory device 606 includes a memory array 600. The memory array 600 can be analogous to the memory array 100 previously described in connection with FIG. 1. Although one memory array 600 is shown in FIG. 6, embodiments of the present disclosure are not so limited, e.g., the memory device 606 can include more than one memory array 600.

The memory device 606 includes an array 600 of memory cells, which can be floating gate flash memory cells with a NAND architecture, as previously described herein. The control circuitry 670 includes address circuitry 640 to latch address signals provided over I/O connections 662 through I/O circuitry 660. Address signals are received and decoded by a row decoder 644 and a column decoder 646 to access the memory array 600. In light of the present disclosure, it will be appreciated by those skilled in the art that the number of address input connections depends on the density and architecture of the memory array 600 and that the number of addresses increases with both increased numbers of memory cells and increased numbers of memory blocks and arrays.

The memory device 606 includes control circuitry 670 coupled to the memory array 600. The control circuitry 670 can be configured to apply a ramping sensing signal to a control gate of a selected memory cell from the memory array 600 and to provide a count while the ramping sensing signal is applied to the control gate of the selected memory cell. The control circuitry 670 can be configured to convert a count to a particular quantization of data, e.g., m-units of hard data, and/or to control the count such that the count provides a particular quantization of data, e.g., m-units of soft hard data. The control circuitry 670 can be configured to output the particular quantization of data, e.g., through I/O circuitry 660.

The control circuitry 670 can sense data in the memory array 600 by sensing voltage and/or current changes in the memory array columns using sensing circuitry that in this embodiment can be read/latch circuitry 650. The read/latch circuitry 650 can read and latch a page, e.g., a row, of data from the memory array 600. I/O circuitry 660 is included for bi-directional data communication over the I/O connections 662 with the host 604. Write circuitry 655 is included to write data to the memory array 600.

The control circuitry 670 decodes signals provided by control connections 664 from the host 604. These signals can include chip signals, write enable signals, and address latch signals that are used to control the operations on the memory array 600, including data sensing, data write, and data erase operations, as described herein. In one or more embodiments, the control circuitry 670 is responsible for executing instructions from the host 604 to perform the operations according to embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Conclusion

The present disclosure includes methods, devices, and systems for outputting data particular quantization of data from memory devices and systems. Outputting data particular quantization of data can include enabling a particular one of a plurality of different quantizations of data. The particular one of the plurality of quantizations of data can then be output.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Program Listing

The following is an example of a program listing in register transfer language (RTL) for adjusting a conversion between a first quantization of data and a second quantization of data for a 3-bit memory cell design using an 8-bit count (where the first quantization is the 8-bit count and the second quantization is a 3-bit quantization).

```
'timescale 1ns / 100ps
module quantization_nbit (/*AUTOARG*/
    // Outputs
    count_out,
    // Inputs
    count_in, trim01, trim12, trim23, trim34, trim45, trim56, trim67,
lowvcc_, read_clk
```

-continued

```
    );
//inputs
//data bus
input       lowvcc_;
input   read_clk;
input [7:0] count_in;    // input data from the counter
input [7:0] trim01;      // this trim defines L0->L1 boundary in binary
input [7:0] trim12;      // this trim defines L1->L2 boundary in binary
input [7:0] trim23;      // this trim defines L2->L3 boundary in binary
input [7:0] trim34;      // this trim defines L3->L4 boundary in binary
input [7:0] trim45;      // this trim defines L4->L5 boundary in binary
input [7:0] trim56;      // this trim defines L5->L6 boundary in binary
input [7:0] trim67;      // this trim defines L6->L7 boundary in binary
//output data bus
Output [2:0]  count_out; // this is the MSB binary count to sense amps
reg [2:0]     count_out;
always @ (negedge read_clk or negedge lowvcc_)
begin
        if (~ lowvcc_)
            count_out   <= 3'h000;
        else
        if (count_in < trim01)
            count_out   <= 3'b000;
        else
        if ( (count_in > trim01) && (count_in <= trim12) )
            count_out   <= 3'b001;
        else
        if ( (count_in > trim12) && (count_in <= trim23) )
            count_out   <= 3'b010;
        else
        if ( (count_in > trim23) && (count_in <= trim34) )
            count_out   <= 3'b011;
        else
        if ( (count_in > trim34) && (count_in <= trim45) )
            count_out   <= 3'b100;
        else
        if ( (count_in > trim45) && (count_in <= trim56) )
            count_out   <= 3'b101;
        else
        if ( (count_in > trim56) && (count_in <= trim67) )
            count_out   <= 3'b110;
        else
        if ( (count_in > trim67) )
            count_out   <= 3'b111;
        else
            count_out   <= count_out;
end
/*
always @ (*)
begin
        if (count_in < trim01)
            count_out    = 3'b000;
        else
        if ( (count_in > trim01) && (count_in <= trim12) )
            count_out    = 3'b001;
        else
        if ( (count_in > trim12) && (count_in <= trim23) )
            count_out    = 3'b010;
        else
        if ( (count_in > trim23) && (count_in <= trim34) )
            count_out    = 3'b011;
        else
        if ( (count_in > trim34) && (count_in <= trim45) )
            count_out    = 3'b100;
        else
        if ( (count_in > trim45) && (count_in <= trim56) )
            count_out    = 3'b101;
        else
        if ( (count_in > trim56) && (count_in <= trim67) )
            count_out    = 3'b110;
        else
        if ( (count_in > trim67) )
            count_out    = 3'b111;
        else
            count_out    = '3b000;
end
*/
endmodule
```

What is claimed is:

1. A method of operating memory, comprising:
outputting a first quantization of data in a first control mode, wherein the first quantization of data represents a number of units of hard data;
providing a count while the sensing signal is applied to the selected memory cell;
asymmetrically incrementing the count; and
outputting a second quantization of data in a second control mode, wherein the second quantization of data represents the number of units of hard data and a particular number of units of soft data.

2. The method of claim 1, wherein the method includes selecting either the first control mode or the second control mode.

3. The method of claim 1, wherein the first quantization of data further represents a second number of units of soft data that is different than the particular number of units of soft data.

4. The method of claim 1, wherein the particular number of units of soft data is greater than the second number of units of soft data.

5. The method of claim 1, wherein the method includes outputting a third quantization of data in a third control mode, wherein the third quantization of data represents the number of units of hard data and a third number of units of soft data.

6. A method of operating memory, comprising:
applying a sensing signal to a selected memory cell;
providing a count while the sensing signal is applied to the selected memory cell;
asymmetrically incrementing the count;
converting the count to a particular quantization of data, or controlling the count such that the count corresponds to the particular quantization of data; and
outputting the particular quantization of data, wherein the particular quantization of data represents a number of units of hard data and a number of units of soft data.

7. The method of claim 6, wherein the method includes adjusting the conversion between the count and the particular quantization of data by setting a trim for converting the count to the particular quantization of data.

8. The method of claim 6, wherein converting the count comprises selectively converting the count at least partially in response to being enabled to convert the count.

9. The method of claim 6, wherein the method includes adjusting the asymmetric incrementing.

10. A memory device, comprising:
an array of memory cells; and
control circuitry coupled to the array and configured to:
apply a sensing signal to a selected memory cell;
provide a count while the sensing signal is applied to the selected memory cell;
asymmetrically incrementing the count;
control the count such that the count corresponds to a particular quantization of data; and
output the particular quantization of data, wherein the particular quantization of data represents a number of units of hard data and a number of units of soft data.

11. The memory device of claim 10, wherein the control circuitry is configured to output the particular quantization of data at least partially in response to the sensing signal causing the selected memory cell to conduct.

12. The memory device of claim 10, wherein the control circuitry is configured to:
selectively convert the count to the particular quantization of data; and output the particular quantization of data or output the count.

13. The memory device of claim 10, wherein the control circuitry is further configured to adjust the conversion between the count and the particular quantization.

14. A memory device, comprising:
an array of memory cells;
a counter configured to provide a count while a sensing signal is output to a selected memory cell within the array of memory cells;
logic configured to control the count such that the count provides a particular quantization of data, wherein the particular quantization of data represents a number of units of hard data and a number of units of soft data; and
sensing circuitry configured to output the particular quantization of data at least partially in response to the sensing signal causing the selected memory cell to conduct.

15. The memory device of claim 14, wherein the logic includes a trim configured to adjust incrementation of the count.

16. The memory device of claim 14, wherein the logic includes a trim configured to adjust decrementation of the count.

17. The memory device of claim 14, wherein the logic includes an input to selectively enable the logic.

18. A memory device, comprising:
an array of memory cells;
a counter configured to provide a count while a sensing signal is output to a selected memory cell within the array of memory cells;
sensing circuitry configured to output the count at least partially in response to the sensing signal causing the selected memory cell to conduct ; and
logic configured to convert the count to a particular quantization of data and to output the particular quantization of data, wherein the particular quantization of data represents a number of units of hard data and a number of units of soft data.

19. The memory device of claim 18, wherein the logic includes a trim configured to adjust the conversion between the count and the hard data.

20. The memory device of claim 18, wherein the logic is configured to:
adjust the conversion between the count and the hard data using the trim; and
reconvert the count to hard data corresponding to the adjusted conversion without the sensing signal being output to the selected memory cell again.

21. The memory device of claim 18, wherein the logic comprises combination logic, and wherein the combination logic includes an input to selectively enable the combination logic.

22. A method of operating memory, comprising:
applying a sensing signal to a selected memory cell;
providing a count while the sensing signal is applied to the selected memory cell;
asymmetrically incrementing the count;
converting the count to a particular quantization of data, or controlling the count such that the count corresponds to the particular quantization of data; and
outputting the particular quantization of data, wherein the particular quantization of data represents a number of units of hard data and a number of units of soft data.

* * * * *